United States Patent
Gonseth et al.

(10) Patent No.: US 11,161,733 B2
(45) Date of Patent: Nov. 2, 2021

(54) DECOUPLING STRUCTURE FOR ACCELEROMETER

(71) Applicant: Safran Colibrys SA, Yverdon-les-Bains (CH)

(72) Inventors: Stephan Gonseth, Morges (CH); Raphael Brisson, Corcelles-pres-Concise (CH); Jacques Moser, Peseux (CH)

(73) Assignee: SAFRAN COLIBRYS SA, Yverdon-les-Bains (CH)

( * ) Notice: Subject to any disclaimer, the term of this patent is extended or adjusted under 35 U.S.C. 154(b) by 112 days.

(21) Appl. No.: 16/608,270

(22) PCT Filed: May 7, 2018

(86) PCT No.: PCT/IB2018/053144
§ 371 (c)(1),
(2) Date: Oct. 25, 2019

(87) PCT Pub. No.: WO2018/122831
PCT Pub. Date: Jul. 5, 2018

(65) Prior Publication Data
US 2020/0180945 A1    Jun. 11, 2020

(30) Foreign Application Priority Data
May 8, 2017  (EP) .................. 17169987

(51) Int. Cl.
*B81B 7/00* (2006.01)
*G01P 15/00* (2006.01)
*G01P 15/08* (2006.01)

(52) U.S. Cl.
CPC ............ *B81B 7/007* (2013.01); *B81B 7/0041* (2013.01); *B81B 7/0048* (2013.01); *G01P 15/0802* (2013.01); *B81B 2201/0235* (2013.01)

(58) Field of Classification Search
CPC ......... B81B 7/00; B81B 7/0048; B81B 7/007; B81B 2201/0235; G01P 15/00–135; G01P 15/0802
See application file for complete search history.

(56) References Cited

U.S. PATENT DOCUMENTS

| 4,800,758 A | 1/1989 | Knecht et al. |
| 8,739,626 B2 * | 6/2014 | Acar ............... G01P 15/125 73/504.04 |

(Continued)

FOREIGN PATENT DOCUMENTS

| DE | 102009046692 A1 | 5/2011 |
| EP | 0599174 B1 | 5/1997 |

(Continued)

OTHER PUBLICATIONS

International Search Report for PCT/IB2018/053144 dated Aug. 28, 2018.
Written Opinion for PCT/IB2018/053144 dated Aug. 28, 2018.

*Primary Examiner* — Nguyen Q. Ha
(74) *Attorney, Agent, or Firm* — Pearne & Gordon LLP

(57) ABSTRACT

Accelerometer including a decoupling structure for fixing the accelerometer on a package and a MEMS sensor chip for measuring an acceleration. The chip is supported by the decoupling structure and includes a sensor wafer layer of a semiconductor material. The decoupling structure forms a bottom portion for fixing the decoupling structure on the package and a top portion fixed to the sensor wafer layer so that the chip is arranged above the decoupling structure. A width of the top portion in a planar direction is smaller than a width of the bottom portion and/or the sensor wafer layer in the planar direction. The decoupling structure is made of the same semiconductor material as the sensor wafer layer. The centre point of the top portion is arranged in a central region of the bottom portion. The chip includes a hermeti- (Continued)

cally closed cavity which includes a seismic mass of the chip.

19 Claims, 6 Drawing Sheets

(56) References Cited

U.S. PATENT DOCUMENTS

| | | |
|---|---|---|
| 2001/0047688 A1 | 12/2001 | Woodruff et al. |
| 2014/0374853 A1 | 12/2014 | Weber et al. |
| 2015/0128703 A1 | 5/2015 | Kaelberer et al. |
| 2015/0309069 A1 | 10/2015 | Boillot et al. |
| 2016/0244324 A1* | 8/2016 | Gurin ................ B81B 7/0058 |
| 2017/0022051 A1* | 1/2017 | Xue ................... B81B 7/0048 |
| 2017/0107098 A1 | 4/2017 | Filhol et al. |
| 2017/0203958 A1* | 7/2017 | Classen ............. B81B 7/0048 |

FOREIGN PATENT DOCUMENTS

| | | |
|---|---|---|
| WO | 2011016859 A2 | 2/2011 |
| WO | 2015103220 A1 | 7/2015 |

* cited by examiner

DECOUPLING STRUCTURE FOR ACCELEROMETER

FIELD OF THE INVENTION

The present invention concerns an accelerometer with a decoupling structure.

DESCRIPTION OF RELATED ART

MEMS (Microelectromechanical systems) accelerometers are used routinely in mobile and automotive applications. They are also selected more and more frequently for use in high-end market segments such as aerospace and defense, where they have to meet particularly stringent stability requirements.

MEMS accelerometers are typically made primarily of materials such as silicon or glass. They are manufactured by wafer processing techniques based on photolithography.

MEMS accelerometers are inherently sensitive to mechanical constraints. FIG. 1a shows a prior art example of MEMS sensor chip 10 which is glued or otherwise fixed by attachments 21 to a base surface 20, e.g. of an assembly like a package, a printed circuit board or other kind of assembly. Stresses applied to the assembly are transferred over the base surface 20 and the attachments 21 to the MEMS chip sensor 10 and result in a deformation of the chip sensor 10 as shown in FIG. 1b whose effect are essentially undistinguishable from the effect of the acceleration to be measured. Therefore, the stresses transferred from the base surface 20 to the MEMS sensor chip 10 lead to a measurement error. Several approaches have been applied to mitigate this issue.

One method is to design the sensor in a symmetrical manner so that stress-induced deformations cancel each other. This method is intrinsically elegant, but severely constraints the design of the sensor.

Another method is to make the sensor itself more rigid. Its drawbacks are that it has only a limited effect and adds potentially limiting design constraints.

A third method is to mechanically decouple the MEMS sensor chip 10 from the part which is attached to the assembly or substrate. One form of this method is to build a frame around the MEMS sensor chip 10, as described e.g. in EP0599174. This method is powerful, but its drawback is that an outer frame adds significantly to the device size. In wafer processing techniques such as those used to build silicon MEMS, this large size translates directly into higher material needs and higher manufacturing costs.

US2001/047688 discloses an accelerometer with a bottom cover with a central mounting pedestal on which an inner frame is supported which supports an external mass.

US2017/0107098 discloses an accelerometer which is connected with a single adhesive or solder bump to a carrier.

In the field of pressure sensors, e.g. in DE102009046692, it is further known to place the pressure sensor on a pedestal in order to decouple the pressure sensor from the stress from the base surface.

In U.S. Pat. No. 4,800,758, a silicon pedestal becomes part of the pressure sensor. The pedestal extends its width versus the base surface and encloses a cavity with the base surface. A channel leads the reference pressure in this cavity through a channel in the socket to the pressure sensor.

For high-performance MEMS accelerometers, in addition to mechanical stress decoupling, other features are also particularly advantageous.

Firstly, it is advantageous that the system formed by the seismic mass, the spring and the electrodes be enclosed in a hermetic cavity. A first advantage of a hermetic cavity is that it provides a protection against dust and other particles from the environment that might penetrate between the adjacent surfaces (said surface typically forming electrodes in the case of so-called capacitive accelerometers). A second advantage is that it provides the possibility to control the nature and the pressure of gases present in the cavity, thus allowing the use of gas damping to optimize the mechanical frequency response of the accelerometer. It is further advantageous, to maintain low manufacturing costs, for the hermetic cavity to be created during wafer processing.

Secondly, it is of particular importance, when integrating the MEMS accelerometer into a system, to control the orientation of the sensitive axis of the accelerometer with respect to the device in which it is mounted. The most direct approach to this requirement is to be able to ensure a good parallelism between an outer surface of the accelerometer and the surface on which it is mounted. This is naturally achieved by providing a bottom surface of the accelerometer of large enough dimensions.

In US2017/0107098 and DE102009046692, the pedestal is directly mounted to the base surface; as a consequence, it is also directly submitted to stresses transmitted by the base surface; also, it offers only a reduced attachment area which does not favour a good control of parallelism.

In DE102009046692, U.S. Pat. No. 4,800,758 and US2017/0107098, additional temperature-dependant stresses are generated between the sensor chip, the attachment material, and the pedestal material. Furthermore, the attachment material (glue or soldering material) may not be perfectly stable with time and undergo plastic deformations, which may cause drifts in the sensor output upon aging.

Finally, the decoupling solutions adopted by US2001/0047688 and by U.S. Pat. No. 4,800,758 are specific to its application. The decoupling solution in US2001/0047688 is specific to an accelerometer with peripheral mass and cannot be applied to an accelerometer where the sensing elements are placed in a closed cavity. The form of the decoupling solution of U.S. Pat. No. 4,800,758 is specific to pressure sensors, since a part of the pressure sensor is incorporated in the decoupling structure.

BRIEF SUMMARY OF THE INVENTION

It is the object to reduce the stress applied to the MEMS sensor chip of accelerometers and reduce the disadvantages of the existing solutions.

The object is solved by an accelerometer configured to be attached on a base surface comprising: a decoupling structure for fixing the accelerometer on the base surface; and a MEMS sensor chip for measuring an acceleration, wherein the MEMS sensor chip is supported by the decoupling structure and comprises a first sensor wafer layer of a semiconductor material. The decoupling structure forms a bottom portion for fixing the decoupling structure on the base surface and a top portion fixed to the first sensor wafer layer so that the MEMS sensor chip is arranged above the decoupling structure. A width of the top portion in a first planar direction is smaller than a width of the bottom portion in the first planar direction. The top portion and the bottom portion are manufactured from the same wafer layer. The centre point of the top portion in the first planar direction is arranged in a central region of the bottom portion in the first planar direction. The decoupling structure is made out of the same semiconductor material as the first sensor wafer layer.

The MEMS sensor chip comprises a hermetically closed cavity which includes a seismic mass of the MEMS sensor chip.

The present invention also presents several advantages over the known solutions based on a pedestal. The reduction of the width from the bottom portion to the top portion of the decoupling structure reduces for the following two reasons the stress on the MEMS sensor chip. The small connection width between the top portion and the MEMS sensor chip compared to the width of the bottom portion reduces the stress on the MEMS sensor chip. In addition, the bottom portion acts as a spring for decoupling the stress of the assembly from the MEMS sensor chip. In addition, the increased width of the bottom portion allows a more robust attachment to a assembly, as well as a better control over the parallelism between the sensor and the assembly. By using the same semiconductor material for the MEMS sensor chip and in the decoupling structure, further stresses at the interface between the MEMS sensor chip and the top portion by aging or temperature changes are avoided.

The present invention also presents advantages over solutions based on a decoupling frame, in that the accelerometer chip benefits from a smaller footprint. Also, the manufacturing process for the decoupling structure is typically shorter and more simple that that of the sensing part; as a result, the savings from the gain in wafer area on all layers of the sensing part tend to more than compensate the additional costs of manufacturing the decoupling structure.

The dependent claims refer to further optional embodiments of the invention.

In one embodiment, the top portion of the decoupling structure and the first sensor wafer layer of the MEMS sensor chip are conductively connected. This avoids that eventual charges could be collected on the first sensor wafer layer of the MEMS sensor chip which could influence the measurement results of the accelerometer.

In one embodiment, the top portion and the first sensor wafer layer are fixed by direct bonding, preferably by silicon fusion bonding. This technology significantly improves further the stress decoupling of the MEMS sensor chip and avoids the appearance, over time, of plastic deformations at the interface between the top portion and the first sensor layer.

In one embodiment, the bottom portion comprises a recess arranged substantially around the top portion. This improves the function of the bottom portion as spring and further reduces the stress on the MEMS sensor chip.

In one embodiment, the recess is arranged such that whenever a stress is applied by the base surface on the bottom portion, the MEMS sensor device will remain substantially parallel with the base surface.

In one embodiment, the accelerometer is an out-of-plane accelerometer. This solution works particularly well for out-of-plane accelerometers, because the first sensor wafer layer is normally an active part of the MEMS sensor chip and thus very sensible to stresses.

In one embodiment, the MEMS sensor chip comprises at least one further sensor wafer layer on the first sensor wafer layer. Preferably, the at least one further sensor layer comprises at least two further sensor layers. a second sensor wafer layer on the first sensor wafer layer, preferably comprising a seismic mass. Especially, for accelerometers with at least two sensor wafer layers, the present solution provides significant material savings compared to a decoupling frame solution. Preferably, the first wafer layer and the at least one further wafer layer form the hermetically closed cavity. Preferably, the at least one further sensor wafer layer comprises the seismic mass. Preferably the second sensor wafer layer comprises the seismic mass.

In one embodiment, the MEMS sensor comprises a second sensor wafer layer on the first sensor wafer layer, preferably comprising a seismic mass, and a third sensor wafer layer on the second sensor wafer layer forming a hermetic cavity for the seismic mass.

In one embodiment, an accelerometer assembly comprises a base surface and an accelerometer as described above, wherein the bottom portion of the decoupling structure is fixed to the base surface at the two lateral sides in the first planar direction.

In one embodiment, (the flexibility of) the decoupling structure is designed such that the fundamental resonant frequency of the MEMS sensor chip is between 3 kHz and 30 kHz. With this flexibility, the optimal decoupling from the base surface is achieved.

BRIEF DESCRIPTION OF THE DRAWINGS

The invention will be better understood with the aid of the description of an embodiment given by way of example and illustrated by the figures, in which:

FIG. 3a shows a first embodiment of a cross section along line III-III in FIG. 2a.

FIG. 3b shows a second embodiment of a cross section along line III-III in FIG. 2a.

FIG. 6b shows a cross section along line V-V in FIG. 6a.

FIG. 8b shows a cross section along line VI-VI in FIG. 8a.

DETAILED DESCRIPTION OF POSSIBLE EMBODIMENTS OF THE INVENTION

Figure 2A:
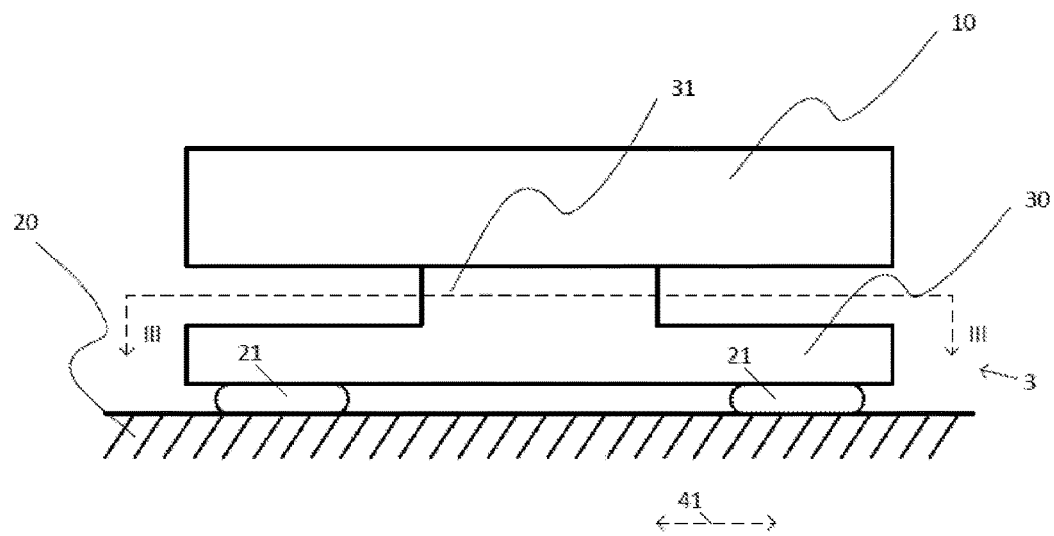
FIG. 2a shows a first embodiment of the accelerometer.

FIG. 2a shows a first embodiment of the accelerometer. The accelerometer is configured to be attached on a base surface 20 of an assembly like a package, an electronic board or any other support part. Preferably, the assembly provides a substrate with a base surface 20 on which the accelerometer is attached. Any directional reference in here like bottom versus top or under versus over or below versus above shall be interpreted in the direction of the normal vector of the base surface 20 and/or of the normal vector of the wafer layers of the accelerometer and/or perpendicular to the first and second planar direction defined later. The directional reference bottom, below, under shall refer to a direction towards the base surface 20 of the assembly. The directional reference top, over, above shall refer to a direction away from the base surface 20 of the assembly. Those directional references are normally independent from the arrangement of the accelerometer with respect to gravity.

The accelerometer comprises a decoupling structure 3 and a MEMS sensor chip 10.

Figure 4:
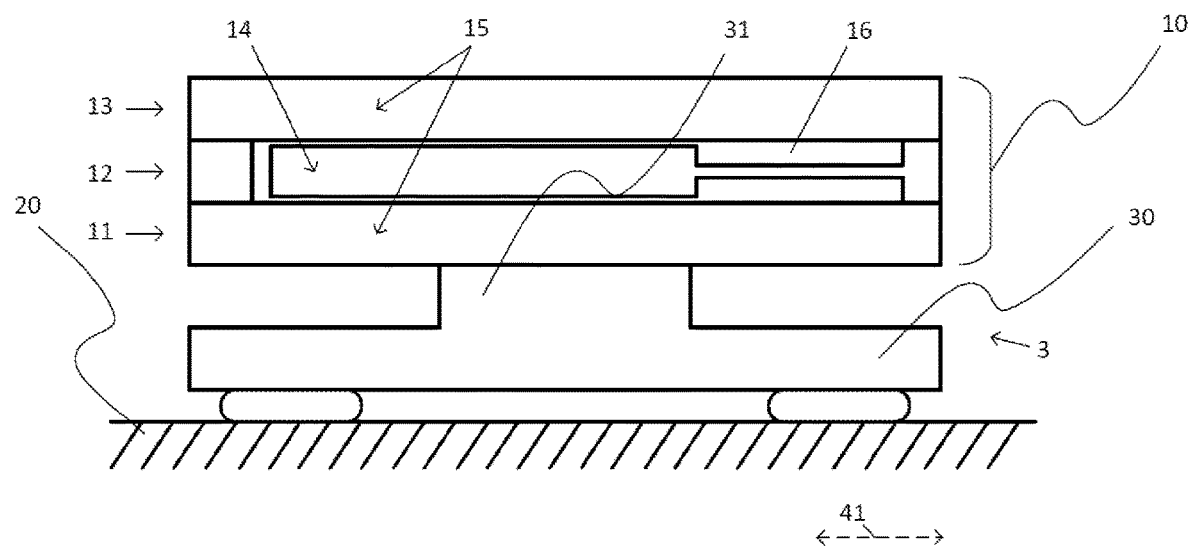
FIG. 4 shows an embodiment of the accelerometer for an out-of-plane accelerometer.
Figure 5:
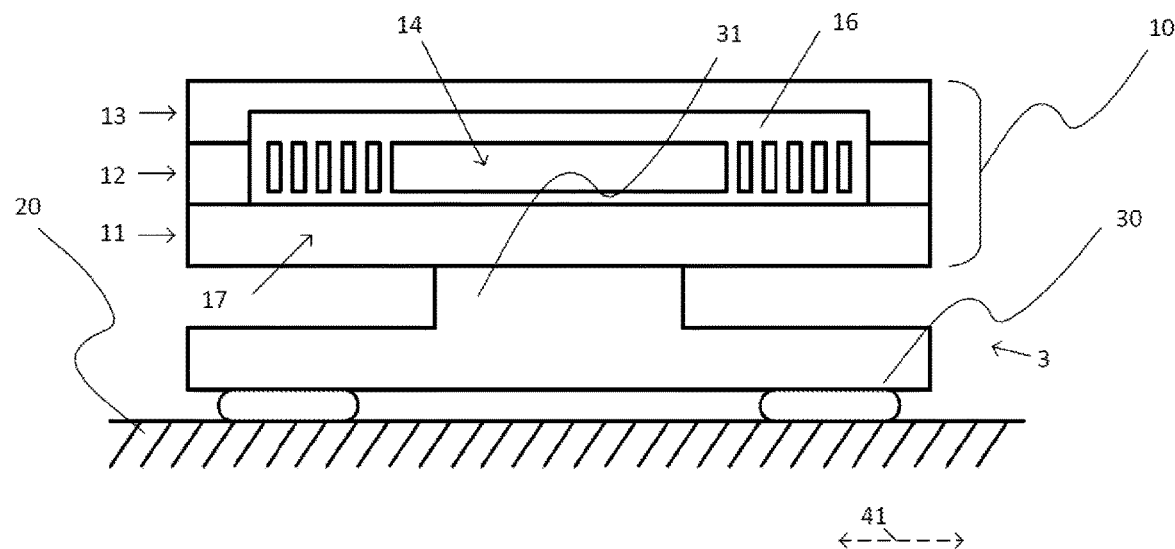
FIG. 5 shows an embodiment of the accelerometer for an in-plane accelerometer.

The MEMS sensor chip 10 is configured to sense an acceleration of the accelerometer. The MEMS sensor chip 10 is also called sensing part. FIGS. 4 and 5 show two exemplary embodiments of the MEMS sensor chip 10. Preferably, the MEMS sensor chip 10 is manufactured from a stack of at least two sensor wafer layers 11 and 12. The first sensor wafer layer 11 is connected to the decoupling structure 3. At least the first sensor wafer layer 11 is made of the same semiconductor material as that of the decoupling structure to provide a better connection between the MEMS sensor chip 10 and the decoupling structure 3 and to more efficiently reduce the stress on the MEMS sensor chip 10. Preferably, the semiconductor material used is silicon. Preferably, all sensor layers are made out of the same semiconductor material as the first sensor wafer layer 11. The MEMS sensor chip 10 comprises a hermetic cavity including a seismic mass 14. The MEMS sensor chip 10 comprises the first wafer layer 11 and at least one further wafer layer, here a second wafer layer 12 and a third wafer layer 13, arranged on top of the first wafer layer 11. The seismic mass 14 is comprised in the at least one further wafer layer, preferably in one of the at least one further wafer layer, preferably in the second wafer layer 12. The seismic mass 14 is supported in the MEMS sensor chip 10 movably such that the seismic mass 14 moves depending on the acceleration of the accelerometer. The movement of the seismic mass 14 is sensed in the MEMS sensor chip 10.

FIG. 4 shows an embodiment of the accelerometer, in particular of the MEMS sensor chip 10 as out-of-plane detector. In this embodiment, the movement of the seismic mass 14 is detected perpendicular to the sensor wafer layer 12 of the seismic mass 14. In this embodiment, the MEMS sensor chip 10 comprises preferably a third sensor wafer layer 13 on the second sensor wafer layer 12 so that the first sensor wafer layer 11 and the third sensor wafer layer 13 form or comprise each a capacitor plate 15 in order to detect the movement of the seismic mass 14 between the two capacitor plates 15. In this embodiment, the first, second and third sensor wafer layer 11, 12, 13 form preferably a hermetically closed cavity 16 which includes the seismic mass 14.

FIG. 5 shows an embodiment of the accelerometer, in particular the MEMS sensor chip 10 as in-plane detector. In this embodiment, the movement of the seismic mass 14 is detected in the plane of the wafer layer of the seismic mass 14. The first sensor wafer layer 11 acts here often only as support plate 17 for the active sensor structure in the second sensor wafer layer 12. The seismic mass 14 is enclosed in a hermetic cavity 16. The hermetic cavity 16 is provided by the first wafer layer 11 and at least one further wafer layer 12, 13. Preferably, the hermetic cavity 16 is provided by a second wafer layer 12 and a third sensor wafer layer 13. The seismic mass 14 is comprised in the at least one further wafer layer 12, 13, preferably in the second wafer layer 12.

The decoupling structure 3 comprises a bottom portion 30 and a top portion 31.

Figure 2B:
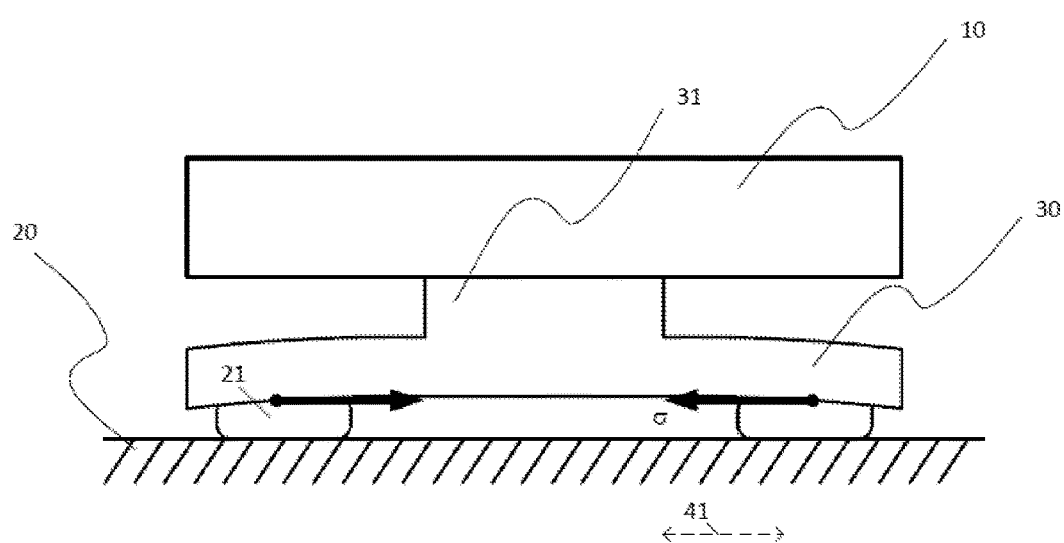
FIG. 2b shows the first embodiment of FIG. 2a in a stress situation.
Figure 3A:
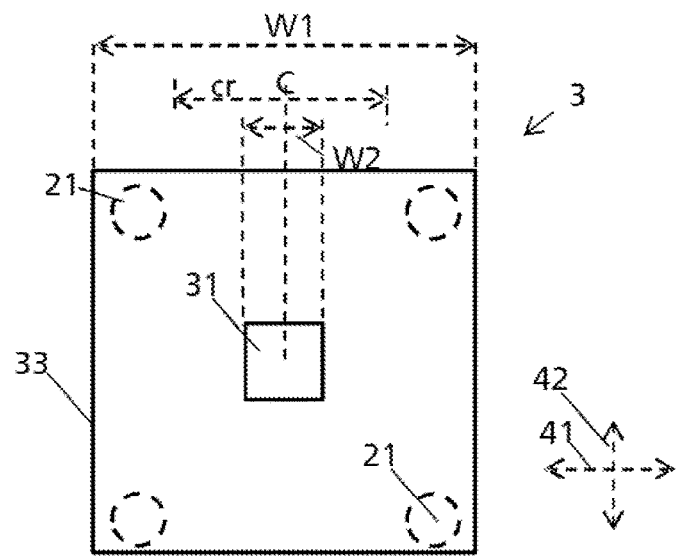

FIG. 3A shows an exemplary embodiment of a cross-sectional view along line III-III in FIG. 2. The top portion 31 has a width w2 in a first planar direction 41 which is smaller than a width w1 of the bottom portion 30 and/or than a width of the first sensor wafer layer 11 of the MEMS sensor chip 10 in the first planar direction 41. A planar direction is a direction in the plane of the (first, second and/or third) wafer layer(s). In other words, the planar direction is a direction parallel to the plane of the respective wafer layer(s), i.e. parallel to the principal surfaces of the wafer layer(s) or parallel to the connection surface between the different wafer layer(s). If the accelerometer has a rectangular design, the first planar direction 41 corresponds preferably to one of the longitudinal axis of the rectangle, preferably to the longest longitudinal axis. A second planar direction 42 is defined as a planar direction perpendicular to the first planar direction 41. Preferably, the width w2 of the top portion 31 in the first planar direction 41 is smaller than fifty percent, preferably than forty percent, preferably than thirty percent, preferably than twenty percent, preferably than ten percent of the width w1 of the bottom portion 30 and/or of the width of the first sensor wafer layer 11 in the first planar direction 41. For manufacturing reasons, the side walls of the top portion 31 could be angulated. In this case, the width w2 of the top portion 31 should be defined at the boundary surface with the MEMS sensor chip 10. Preferably, the centre point C of the top portion 31 in the first planar direction 41 is arranged in a central region cr of the bottom portion 30 and/or of the first sensor wafer layer 11. The central region comprising the central 50%, preferably the central 40%, preferably the central 30%, preferably the central 20%, preferably the central 10% of the width w1 of the bottom portion 30 and/or of the width of the first sensor wafer layer 11 in the first planar direction 41.

Preferably, the top portion 31 has a width in the second planar direction 42 which is smaller than a width of the bottom portion 30 and/or of the first sensor wafer layer 11 of the MEMS sensor chip 10 in the second planar direction 42. Preferably, the width of the top portion 31 in the second planar direction 42 is smaller than fifty percent, preferably than forty percent, preferably than thirty percent, preferably than twenty percent, preferably than ten percent of the width of the bottom portion 30 and/or the first sensor wafer layer 11 in the second planar direction 42. Preferably, the centre point of the top portion 31 in the second planar direction 42 is arranged in a central region of the bottom portion 30 and/or of the first sensor wafer layer 11. The central region comprising the central 50%, preferably the central 40%, preferably the central 30%, preferably the central 20%, preferably the central 10% of the width of the bottom portion 30 and/or of the first sensor wafer layer 11 in the second planar direction 42.

Figure 3B:
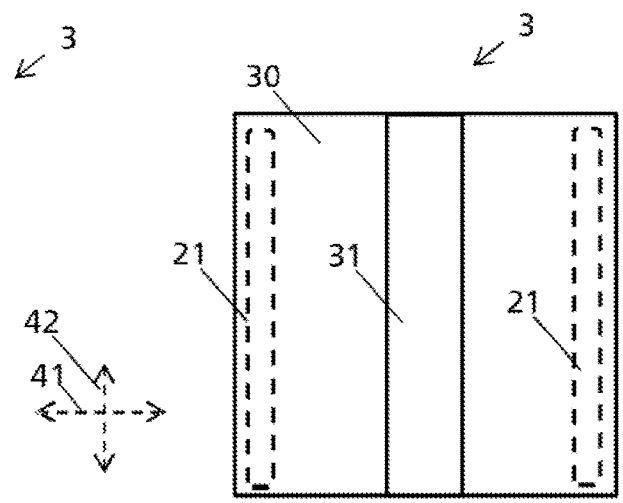

FIG. 3B shows an alternative embodiment in which the top portion 31 has the same width as the bottom portion 30 in the second planar direction 42. This could be a solution, when a stress on the MEMS sensor chip 10 is only expected and/or disturbs only in the first planar direction 41.

In the shown embodiments, the form of the top portion 31 is quadratic or rectangular. However, any other form of the top portion 31. The top portion 31 could have the form of a circle (a width in the first planar direction 41 is equal to a width in the second planar direction 42), ellipsoid (a width in the first planar direction 41 is different to a width in the second planar direction 42) or any other free form.

Figure 1A:
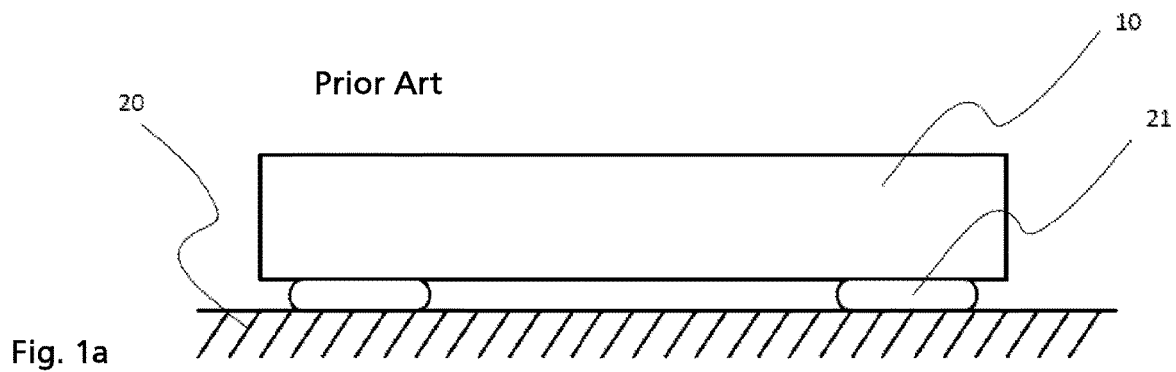
FIG. 1a shows a MEMS sensor chip according to the prior art attached to a based surface.
Figure 1B:
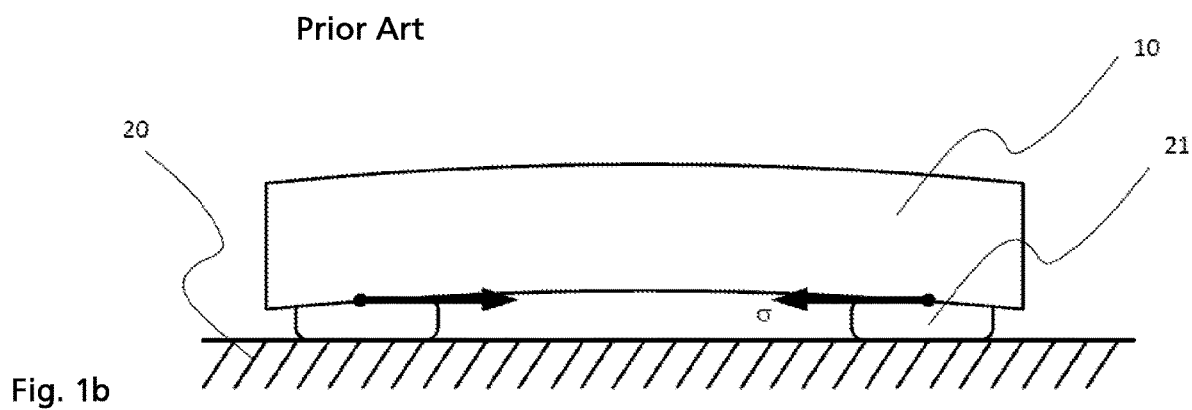
FIG. 1b shows the MEMS sensor chip of FIG. 1a in a stress situation.

The bottom portion 30, in particular the bottom portion 30 outside of the region of the top portion 31, is configured to act as a spring which reduces the transferred stress. Preferably, the bottom portion 30, in particular the bottom portion 30 outside of the region of the top portion 31, is flexible. This can be achieved for example by a bottom portion 30 with a thickness of the bottom portion 30 (outside of the top portion 30) of the decoupling structure 3 being smaller than (w1−w2), preferably smaller than 30% of (w1−w2), preferably smaller than 10% of (w1−w2). The flexibility of the decoupling portion 3 is often described by its fundamental resonant frequency, which is the frequency of the first resonant mode ($0^{th}$ harmonic frequency) of the MEMS sensor chip 10, when the accelerometer is solicited by a transverse effort at the attachments 21 (see stresses drawn in FIG. 1b), in particular a transverse effort at the attachments 21 in the first planar direction 41. The design of the decoupling structure 3, in particular the flexibility of the bottom portion 30 allows to define the fundamental resonant frequency. The assembly, in particular the accelerometer, in particular the decoupling structure 3 is designed such that the fundamental resonant frequency of the MEMS sensor chip 10 is smaller than 40 kHz (Kilohertz), preferably smaller than 35 kHz, preferably smaller than 30 kHz and/or is larger than 1 kHz, preferably than 2 kHz, preferably than 3 kHz.

The MEMS sensor chip 10 and the decoupling portion 3 form the accelerometer. The accelerometer could also be called accelerometer chip.

The assembly comprises at least the base surface 20 and the accelerometer (chip). The assembly is for example a package, an electronic board, a printed circuit board or any other assembly. Preferably, the assembly comprises a substrate which forms the base surface 20 on which the accelerometer is attached. The decoupling portion 3 of the accelerometer is glued or otherwise fixed to the base surface 20 of the assembly with the attachments 21 arranged versus the sides of the bottom portion 30 on the bottom surface. Preferably, the attachments 21 are only in the four corners of the bottom portion 30 as shown in FIG. 3A. However, it is also possible to arrange the attachments along the full sides which extend along the second planar direction 42 as shown in FIG. 3B. There are two main reasons which reduce the stress σ from the lower surface of the bottom portion 30 to the imaginary boundary surface between the top portion 31 and the bottom portion 30. First, the reduced width of the imaginary boundary surface compared to the lower surface of the bottom portion 30 lead to first stress reduction. This is due to the fact that the same bending over shorter distance leads to less shear forces. Second, the bottom portion 30 works between the attachments 21 and the region in which the top portion 30 is arranged like a spring which reduces the transferred stress. This effect is increased by lowering the thickness of the bottom portion 30. The thickness of the top portion 31 reduces the stress at said imaginary boundary further at the boundary surface between the top portion 31 and the MEMS sensor chip 10. This is due to the stiffness of the top portion 31. This effect can be strengthened by increasing the thickness of the top portion 31.

The bottom portion 30 and the top portion 31 are made from the same (decoupling) wafer layer. This can be realized by removing the material from the wafer layer around the top layer 31. This has the advantage that the bottom portion 30 and the top portion 31 are made of the same material block. Thereby additional stress at a connection surface between the top portion 31 and the bottom portion 30 is avoided.

Preferably, the decoupling structure 3 is made from the same semiconductor material as the first sensor wafer layer 11 of the MEMS sensor chip 10. This avoids stress at the boundary surface between the top portion 31 and the first sensor wafer layer 11, because different expansions of the material with temperature changes and aging are avoided. Preferably, silicon is used as a semiconductor material.

Preferably, the decoupling structure 3 or the top portion 31, respectively, is fixed to the MEMS sensor chip 10 or the first sensor wafer layer 11, respectively, by direct bonding. Preferably, silicon fusion bonding is used. This allows a connection which acts nearly like made from one material block and causes therefore a minimum of stress.

In the embodiments in FIGS. 2 to 5, the width of the MEMS sensor chip 10 in the first planar direction 41 is equal to the width w1 of the bottom portion 30 of the decoupling structure 3. This optimizes the material use during manufacturing. Preferably, the width of the MEMS sensor chip 10 in the second planar direction 42 is equal to the width w1 of the bottom portion 30 of the decoupling structure 3. This optimizes the material use during manufacturing and facilitates the manufacturing process. Preferably, the size of the bottom portion 30 in the plane of the sensor wafer layers corresponds to the size of the MEMS sensor chip 10 in the plane of the sensor wafer layers. Allowing a bottom portion 30 with substantially the same width(s) and/or size as the MEMS sensor chip 10 makes the whole accelerometer particularly well suited to fabrication using wafer processing techniques; in particular, the decoupling structure 3 can be attached to the MEMS sensor chip 10 while still in wafer form, without the need for complex, cumbersome and costly chip-to-chip operations FIG. 2b shows an example stress situation for the accelerometer of FIG. 2a.

Figure 6A:
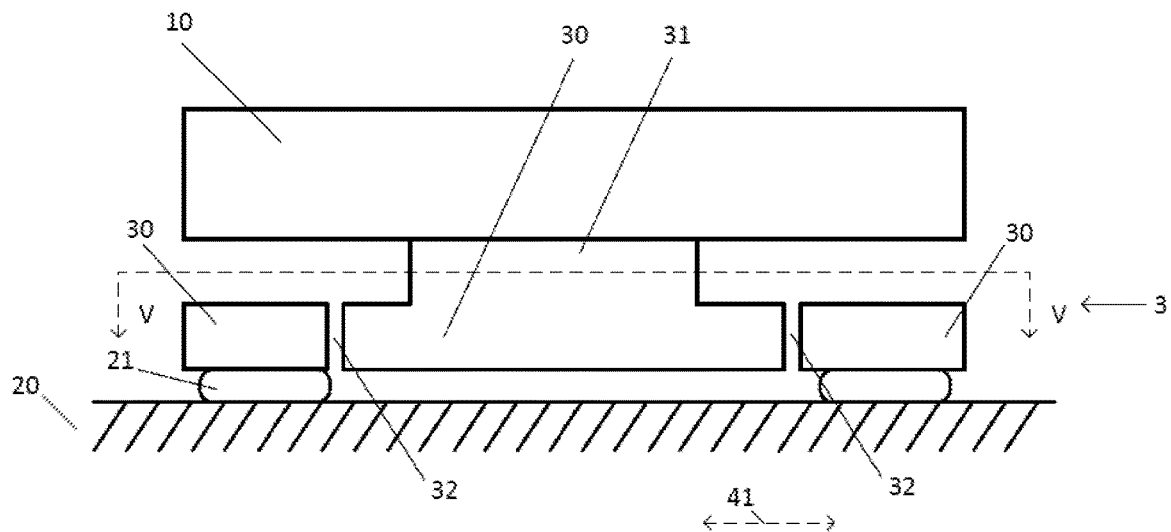
FIG. 6a shows a third embodiment of the accelerometer.
Figure 6B:
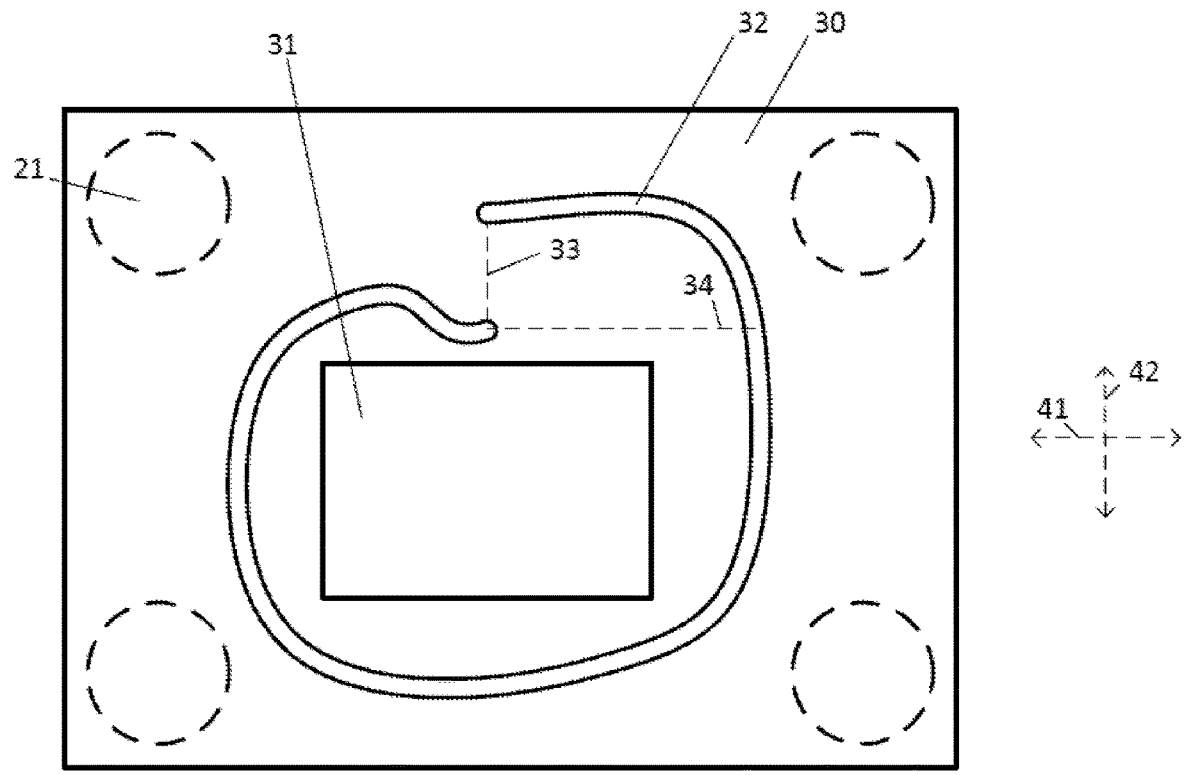

FIGS. 6a and 6b show an advantageous embodiment for the decoupling structure 3. The bottom portion 30 comprises additionally a recess 32 for increasing the elasticity between the attachments 21 and the top portion 31 in the bottom portion 30. The recess 32 extends from a first point to a second point substantially around the top portion 31. The first point and the second point are preferably the two end points of the recess 32. Preferably, the recess 32 is a continuous cut-out extending through the complete thickness of the bottom portion 30 such that a first decoupling area within the recess 32 is connected (only) via a connecting line 33 between the first point and the second point to the rest of the bottom portion 30.

The described recess 32 is realised as a continuous cut-out extending through the complete thickness of the bottom portion 30. It is however also possible to reduce the stress inside the recess 32 by a non-continuous recess, e.g. like a perforation line (alternating portions of cut-outs and connecting parts) or by a recess not extending through the complete thickness of the bottom portion 30, e.g. like a groove. In this case, a connecting part 33 could be omitted. The arrangement of the recess 32 in FIG. 6b is a preferred embodiment. However, also other arrangements of the recess 32 are possible. In one embodiment, the recess could cover only a part of one or more of the four sides of top portion 31. In one embodiment, the recess 32 could form multiple connecting parts. Another example would be a recess 32, in particular a cut-out, going around the top portion 31, e.g. with the same distance from the top portion 31, and comprising two connecting portions in the centre of two opposing sides of the recess 32. Those two opposing sides preferably extend in the direction of the first planar direction 41. Many other arrangements of the recess 32 around the top portion 31 are possible.

Figure 7A:
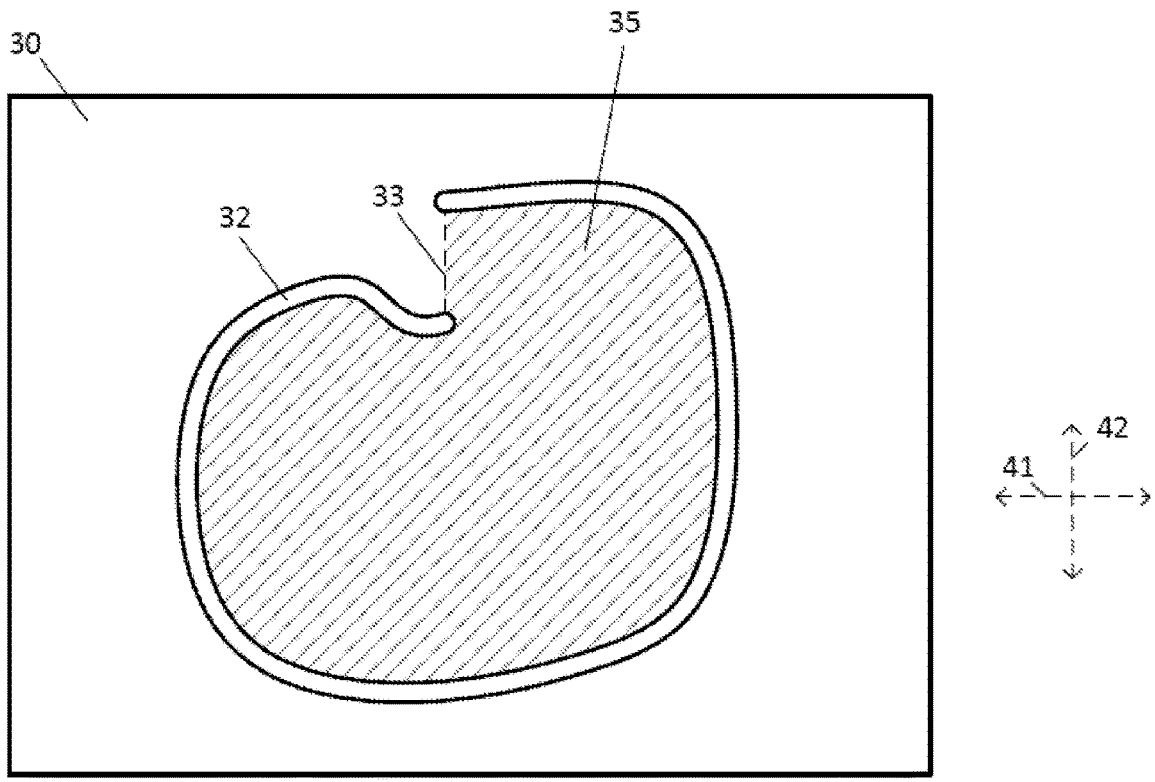
FIG. 7a shows a first decoupling area in the third embodiment.

A first decoupling region 35 is defined as the region enclosed by the recess 32 and the connecting line 33 as shown in FIG. 7a with the shaded region. Preferably, the top portion 31 is arranged in the first decoupling region 35. Inside this first decoupling region 35, the top and bottom portions 30 and 31 are essentially isolated from stresses applied to the bottom portion 30 outside the first decoupling zone 35 in a plane perpendicular to the connecting line. Preferably, the connecting line 33 is arranged perpendicular to the first planar direction such that stresses in the first planar direction do not influence the top portion 31.

Figure 7B:
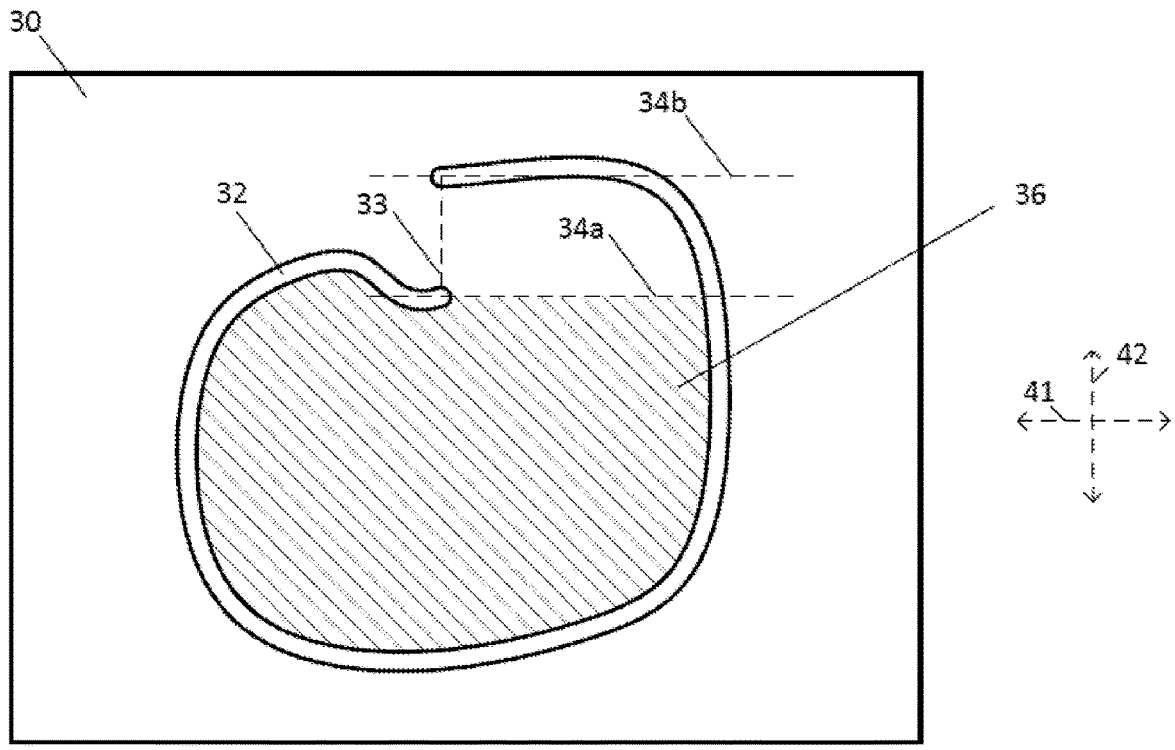
FIG. 7b shows a second decoupling area in the third embodiment.

A second decoupling region 36 is defined within the first decoupling region 35 as shown in FIG. 7b with the shaded region. The second decoupling region 36 is defined as the first decoupling region 35 without a transit region enclosed by the recess 32, the connecting line 33, a line 34a extending from the first point in a direction perpendicular to the connecting line and a line 34b extending from the second point in a direction perpendicular to the connecting line 33. The line(s) 34a and/or 34b extend(s) preferably in the direction inside the first decoupling region 35. Inside this second decoupling region 36, the top and bottom portions 30 and 31 are also essentially isolated from stresses applied to the bottom portion 30 outside the first decoupling zone in a plane parallel with the connecting line 33. Preferably, the top portion 31 is arranged in the second decoupling region 36.

Preferably, the recess 32 is arranged so that the bending of the bottom portion 30, as a result of stresses applied by the base surface 20 over the attachments 21, results in a simple translation of the top portion 31, whereby the top surface of the top portion 31 remains substantially parallel with the base surface 20. This is of particular interest for accelerometers, as a tilt of the top portion 31 with respect to base surface 20 would result in unwanted so-called cross-axis sensitivity.

The form of the recess 32 shown in FIGS. 6 and 7 is random. Any other form of the recess 32 could be used.

As the presence of a recess 32 in the bottom portion 30 increases the flexibility of the bottom portion 30 in conditions of stress, the location and the shape of the recess 32 will influence the location where the bending of the bottom portion 30 will be maximum, and hence the location where the connecting line 33 and the top portion 31 should be placed in order to attain the condition of simple translation.

Figure 8A:
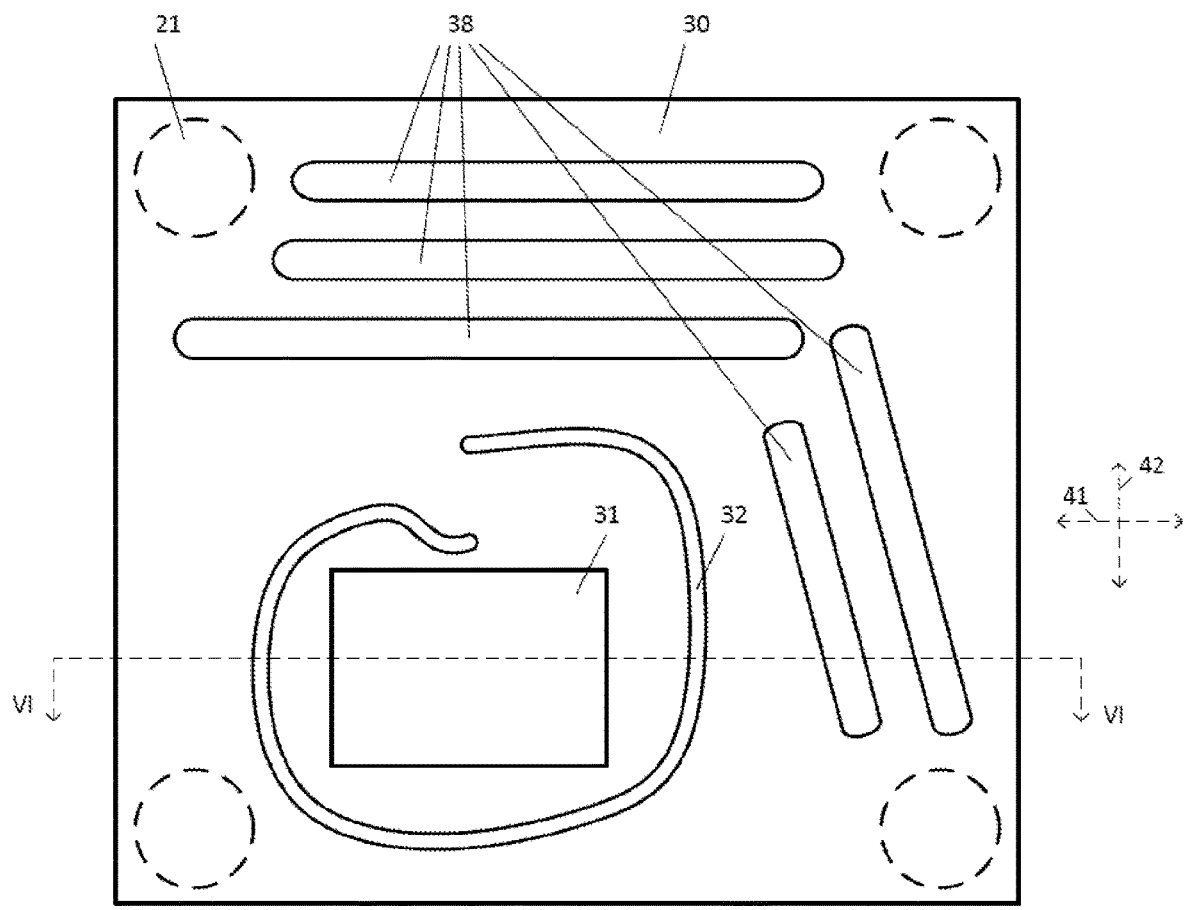
FIG. 8a shows a fourth embodiment of the accelerometer
Figure 8B:
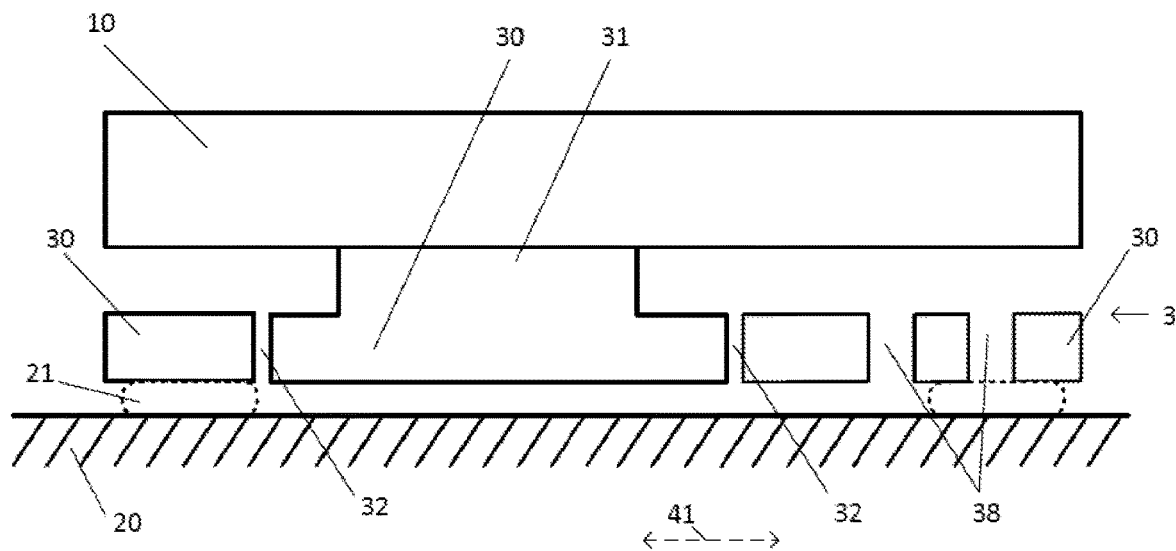

FIGS. 8a and 8b show a further embodiment of the accelerometer. In this embodiment, the top portion 31 and/or the recess 32 is/are arranged eccentrically. Since the recess 32 significantly increases the local flexibility of the bottom portion, the bending of the bottom portion 30 will not be symmetrical anymore. Due to this effect, surprisingly the top portion 31 and/or the first and/or second decoupling region 35/36 are kept more stable (more parallel to the base surface) close to the corners and/or borders than in the centre. Another measure for improving the stability of the top portion 31 and/or the first and/or second decoupling region 35/36 is to introduce in addition to the recess 32 at least one additional recess 38 which is arranged in the bottom portion 30 outside the first decoupling region 35. This at least one additional recess 38 is arranged to influence the bending of the bottom portion 30 in such a manner that the top surface of the top portion 31 remains substantially parallel with the base surface 20 in conditions of stress or at least more parallel than without this additional recess 38. The additional recess(es) 38 are used to tune locally the flexibility of bottom portion. Thus, the top portion 31 can be arranged more centrally without increasing the instability.

What is claimed is:

1. Accelerometer configured to be attached on a base surface and comprising:
   a decoupling structure for fixing the accelerometer on the base surface; and
   a MEMS sensor chip for measuring an acceleration, wherein the MEMS sensor chip is supported by the decoupling structure and comprises a first sensor wafer layer of a semiconductor material;
   wherein the decoupling structure forms a bottom portion for fixing the decoupling structure on the base surface and a top portion fixed to the first sensor wafer layer so that the MEMS sensor chip is arranged above the decoupling structure;
   wherein a width of the top portion in a first planar direction is smaller than a width of the bottom portion in the first planar direction;
   wherein the top portion and the bottom portion are manufactured from the same wafer layer;
   wherein the centre point of the top portion in the first planar direction is arranged in a central region of the bottom portion in the first planar direction;
   wherein the decoupling structure is made out of the same semiconductor material as the first sensor wafer layer, and
   wherein the MEMS sensor chip comprises a hermetically closed cavity which includes a seismic mass of the MEMS sensor chip.

2. Accelerometer according to claim 1, wherein the width of the top portion in first planar direction is smaller than fifty percent of the width of the bottom portion and/or the first sensor wafer layer in the first planar direction.

3. Accelerometer according to claim 1, wherein the central region comprises centred fifty percent of the width of the first sensor wafer layer and/or of the bottom portion in the first planar direction.

4. Accelerometer according to claim 1, wherein a width of the top portion in a second planar direction is smaller than a width of the bottom portion and/or of the first sensor wafer layer in the second planar direction.

5. Accelerometer according to claim 1, wherein the width of the bottom portion in first planar direction is equal to the width of the first sensor wafer layer in the first planar direction.

6. Accelerometer according to claim 1, wherein a width of the bottom portion in a second planar direction is equal to the width of the first sensor wafer layer in the second planar direction, wherein the second planar direction is a planar direction perpendicular to the first planar direction.

7. Accelerometer according to claim 1, wherein the MEMS sensor chip comprises at least one further sensor wafer layer on the first sensor wafer layer, wherein the first wafer layer and the at least one further wafer layer form the hermetically closed cavity, preferably the at least one further sensor wafer layer comprises a second sensor wafer layer on the first sensor wafer layer and a third sensor wafer layer on the second sensor wafer layer and preferably the first, second and third sensor wafer layer form the hermetically closed cavity.

8. Accelerometer according to claim 7, wherein the at least one further sensor wafer layer, preferably the second sensor wafer layer comprises the seismic mass.

9. Accelerometer according to claim 8, wherein the MEMS sensor chip is an out-of-plane detector configured such that the movement of the seismic mass is detected perpendicular to the second sensor wafer layer of the seismic mass, wherein the two sensor wafer layers below and above the sensor wafer layer comprising the seismic mass, preferably the first sensor wafer layer and the third sensor wafer layer form or comprise each a capacitor plate in order to detect the movement of the seismic mass between the two capacitor plates.

10. Accelerometer according to claim 1, wherein the top portion and the first sensor wafer layer are conductively connected.

11. Accelerometer according to claim 1, wherein the top portion and the first sensor wafer layer are fixed by direct bonding, preferably by silicon fusion bonding.

12. Accelerometer according to claim 1, wherein the bottom portion comprises a recess arranged substantially around the top portion, wherein the recess extends from a first point to a second point, wherein a first decoupling region is defined as the region enclosed by the recess and a connecting line between the first point and the second point, wherein the top portion is arranged in the first decoupling region, wherein a second decoupling region is defined as the first decoupling region minus a transit region enclosed by the recess, the connecting line, a line extending from the first point in a direction perpendicular to the connecting line and a line extending from the second point in a direction perpendicular to the connecting line, wherein the top portion is arranged in the second decoupling region.

13. Accelerometer according to claim 12, wherein the bottom portion comprises at least one additional recess located outside the first decoupling region.

14. Accelerometer according to claim 12, wherein the recess is a continuous cut-out extending through the complete thickness of the bottom portion.

15. Accelerometer according to claim 1, wherein a thickness of the bottom portion of the decoupling structure is smaller than the width of the bottom portion in the first planar direction minus the width of the top portion in the first planar direction.

16. Accelerometer according to claim 15, wherein the thickness of the bottom portion of the decoupling structure is smaller than thirty percent of the difference calculated by the width of the bottom portion in the first planar direction minus the width of the top portion in the first planar direction.

17. Accelerometer according to claim 1, wherein the bottom portion is configured to act as a spring for decoupling the stress of the base surface from the MEMS sensor chip.

18. Assembly comprising a, preferably flat, base surface and an accelerometer according to claim 1, wherein the decoupling portion of the accelerometer is glued or otherwise fixed to the base surface with attachments arranged versus the sides of the bottom portion in the first planar direction on a bottom surface of the bottom portion.

19. Assembly according to claim 18, wherein the decoupling structure is designed such that the fundamental resonant frequency of the MEMS sensor chip is between 3 kHz and 30 kHz.

* * * * *